United States Patent
Lu et al.

(10) Patent No.: US 9,929,078 B2
(45) Date of Patent: Mar. 27, 2018

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Wen-Long Lu, Kaohsiung (TW); Chi-Chang Lee, Kaohsiung (TW); Wei-Min Hsiao, Kaohsiung (TW); Yuan-Feng Chiang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 14/995,572

(22) Filed: Jan. 14, 2016

(65) Prior Publication Data

US 2017/0207151 A1    Jul. 20, 2017

(51) Int. Cl.
*H01L 23/31*    (2006.01)
*H01L 23/495*   (2006.01)
(Continued)

(52) U.S. Cl.
CPC .... *H01L 23/49572* (2013.01); *H01L 21/4825* (2013.01); *H01L 21/565* (2013.01); (Continued)

(58) Field of Classification Search
None
See application file for complete search history.

(56) References Cited

U.S. PATENT DOCUMENTS

2006/0192301 A1* 8/2006 Leal ...................... H01L 21/566
                                                                  257/787
2012/0086003 A1* 4/2012 Park ....................... H01L 21/56
                                                                  257/48

(Continued)

FOREIGN PATENT DOCUMENTS

| JP | 55-044737   | 3/1980  |
|----|-------------|---------|
| JP | 63-262860   | 10/1988 |
| JP | 2003-273571 | 9/2003  |

OTHER PUBLICATIONS

Shigley, J.E., "Mechanical Engineering Design," McGraw-Hill Book Company, 5th Ed., (1989), pp. 747 only.

*Primary Examiner* — Charles Garber
*Assistant Examiner* — Alia Sabur
(74) *Attorney, Agent, or Firm* — Foley & Lardner LLP; Cliff Z. Liu

(57) ABSTRACT

A semiconductor package structure includes a conductive structure, at least two semiconductor elements and an encapsulant. The conductive structure has a first surface and a second surface opposite the first surface. The semiconductor elements are disposed on and electrically connected to the first surface of the conductive structure. The encapsulant covers the semiconductor elements and the first surface of the conductive structure. The encapsulant has a width 'L' and defines at least one notch portion. A minimum distance 'd' is between a bottom surface of the notch portion and the second surface of the conductive structure. The encapsulant has a Young's modulus 'E' and a rupture strength '$S_r$', and $L/(K \times d) > E/Sr$, wherein 'K' is a stress concentration factor with a value of greater than 1.2.

19 Claims, 8 Drawing Sheets

(51) Int. Cl.
    *H01L 21/48*      (2006.01)
    *H01L 21/56*      (2006.01)
    *H01L 23/29*      (2006.01)

(52) U.S. Cl.
    CPC ........ *H01L 23/293* (2013.01); *H01L 23/3114* (2013.01); *H01L 23/49575* (2013.01)

(56) References Cited

U.S. PATENT DOCUMENTS

2013/0301228 A1* 11/2013 Tao .................. H01L 21/561
                                              361/748
2014/0217597 A1* 8/2014 Lin .................... H01L 24/19
                                              257/773

* cited by examiner

US 9,929,078 B2

SEMICONDUCTOR PACKAGE STRUCTURE AND METHOD FOR MANUFACTURING THE SAME

BACKGROUND

1. Field of the Disclosure

The present disclosure relates to a semiconductor package structure and a semiconductor process, and more particularly to a flexible semiconductor package structure and a method for manufacturing the same.

2. Description of the Related Art

Some conventional semiconductor package structures are stiff structures and not able to conform to a space in a device into which the semiconductor package structure is incorporated, such as against a curved surface of the device, or such as in a flexible space.

SUMMARY

In an aspect, a semiconductor package structure includes a conductive structure, at least two semiconductor elements and an encapsulant. The conductive structure has a first surface and a second surface opposite the first surface. The semiconductor elements are disposed on and electrically connected to the first surface of the conductive structure. The encapsulant covers the semiconductor elements and the first surface of the conductive structure. The encapsulant has a width 'L' and defines at least one notch portion. A minimum distance 'd' is between a bottom surface of the notch portion and the second surface of the conductive structure. The encapsulant has a Young's modulus 'E' and a rupture strength '$S_r$', and $L/(K \times d) > E/S_r$, wherein 'K' is a stress concentration factor with a value of greater than about 1.2.

In another aspect, a semiconductor package structure includes a conductive structure, at least two semiconductor elements and an encapsulant. The semiconductor elements are disposed on and electrically connected to the conductive structure. The encapsulant covers the semiconductor elements and a surface of the conductive structure. The encapsulant is, or includes, a thermoplastic material and defines at least one notch portion. The semiconductor package structure is bendable along the notch portion.

In another aspect, a method for manufacturing a semiconductor package structure includes: (a) disposing at least two semiconductor elements on a conductive structure; and (b) disposing an encapsulant on the conductive structure to cover the semiconductor elements to form a semiconductor package structure. The encapsulant defines a notch portion, and the semiconductor package structure is bendable along the notch portion.

DETAILED DESCRIPTION

The present disclosure describes an improved wafer level semiconductor package structure and improved techniques for manufacturing the wafer level semiconductor package structure. The wafer level semiconductor package structure and techniques of the present disclosure are suitable for use in flexible devices.

A manufacturing process of making a wafer level semiconductor package structure may begin with bonding dice to a conductive structure disposed on a surface of a wafer level substrate, followed by forming a molding material on the surface of the wafer level substrate to encapsulate the dice. After the molding material is solidified (e.g., cured), the wafer level substrate may be removed (e.g., by grinding) so as to obtain individual wafer level semiconductor package structures.

As described in the present disclosure, to avoid stiffness of the semiconductor package structure, an improved molding material is used, and a notch is formed in the molding material. Cooperation of the molding material and the notch is desired such that the wafer level semiconductor package structure is bendable along a length of the notch, thus; the molding material is selected considering parameters of the notch, or one or more parameters of the notch may be selected considering properties of the molding material.

Figure 1:
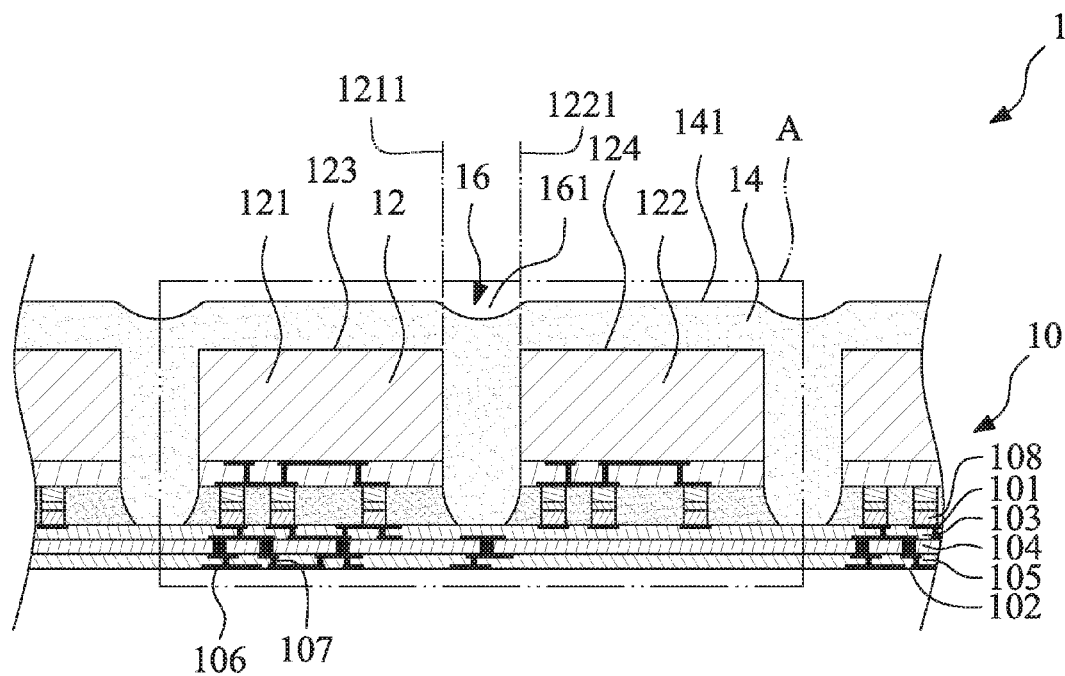
FIG. 1 illustrates a cross-sectional view of a semiconductor package structure according to an embodiment of the present disclosure.

FIG. 1 illustrates a cross-sectional view of a semiconductor package structure 1 according to an embodiment of the present disclosure. The semiconductor package structure 1 includes a conductive structure 10, multiple semiconductor elements 12 and an encapsulant 14.

The conductive structure 10 is flexible. The conductive structure 10 has a first surface 101 and a second surface 102 opposite the first surface 101. The conductive structure 10 includes a redistribution layer (RDL) that includes a first insulation layer 103, a second insulation layer 104, a third insulation 105, circuit layers 106, conductive vias 107 and conductive bumps 108.

The first insulation layer 103 may be, for example, a passivation layer, and the material thereof may be, or may include, a polyimide (PI), an epoxy, polybenzoxazole (PBO), benzocyclobutene (BCB), silicon dioxide ($SiO_2$), or other suitable material. The second insulation layer 104 may be, for example, a polymer layer, and the material thereof may be, or may include, a non-conductive film (NCF), a non-conductive paste (NCP), Ajinomoto build-up film (ABF), or other suitable material. The third insulation layer 105 may be, for example, a passivation layer, and the material thereof may be, or may include, a PI, an epoxy, PBO, BCB, SiO$_2$, or other suitable material. The material of the third insulation layer 105 may be the same as, or different from, the material of the first insulation layer 103.

As shown in FIG. 1, the patterned circuit layers 106 are disposed on or embedded in the first insulation layer 103 or the third insulation layer 105. The second insulation layer 104 is disposed between the first insulation layer 103 and the third insulation layer 105. In one or more embodiments, the second insulation layer 104 may be omitted. In one or more embodiments, insulation layers additional to the second insulation layer 104 may be disposed between the first insulation layer 103 and the third insulation layer 105. Portions of the conductive vias 107 are disposed in the first insulation layer 103, the second insulation layer 104 (and additional insulation layers if applicable) and the third insulation 105, to electrically connect the patterned circuit layers 106 to each other vertically (in the orientation shown). A top patterned circuit layer 106 is exposed from the first surface 101 of the conductive structure 10, and the conductive bumps 108 are disposed on the top patterned circuit layer 106.

The semiconductor elements 12 are disposed on and electrically connected to the first surface 101 of the conductive structure 10 through the conductive bumps 108. In the embodiment illustrated in FIG. 1, the semiconductor elements 12 include a first semiconductor element 121 and a second semiconductor element 122, which are semiconductor dice. The semiconductor elements 12 may be active elements or passive elements. In one or more embodiments, a thickness (e.g., a height vertically) of the first semiconductor element 121 is approximately equal to a thickness of the second semiconductor element 122.

The encapsulant 14 covers and encapsulates the semiconductor elements 12 and the first surface 101 of the conductive structure 10. In one or more embodiments, the encapsulant 14 is, or includes, a thermoplastic material (e.g., TZNR-A4012, a product of Tokyo Ohka Kogyo Co., Ltd.). The encapsulant 14 defines at least one notch portion 16. The notch portion 16 includes an opening 161 on a top surface 141 of the encapsulant 14. A first imaginary plane 1211 extends vertically from a side wall of the first semiconductor element 121 that faces the second semiconductor element 122, and a second imaginary plane 1221 extends vertically from a side wall of the second semiconductor element 122 that faces the first semiconductor element 121. The notch portion 16 is disposed between the first imaginary plane 1211 and the second imaginary plane 1221. That is, the notch portion 16 is disposed between two imaginary planes 1211, 1221 extending from two adjacent side walls of two adjacent semiconductor elements 121, 122, respectively. In one or more embodiments, the notch portion 16 extends along the top surface 141, and forms a trough substantially perpendicular to the cross-section of FIG. 1.

Figure 2:
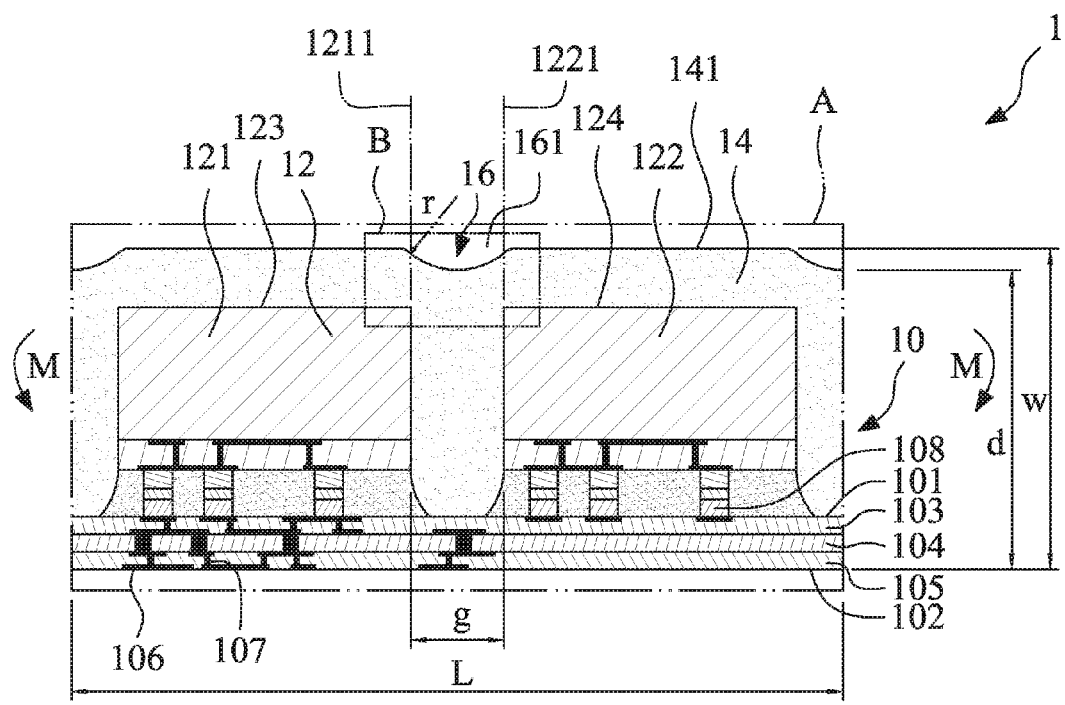
FIG. 2 illustrates an enlarged view of a section 'A' of FIG. 1 according to an embodiment of the present disclosure.

FIG. 2 illustrates an enlarged view of a section 'A' of FIG. 1 according to an embodiment of the present disclosure. In FIG. 2, a gap width 'g' is defined as a width of a gap between the first semiconductor element 121 and the second semiconductor element 122. Within the section 'A' of FIG. 1 enlarged in FIG. 2 (which includes two semiconductor elements 12 and the notch 16 between), the encapsulant 14 has a width 'L', and a thickness 'w' is a total thickness of the semiconductor package structure 1. A minimum distance 'd' is defined as a minimum distance between a bottom surface of the notch portion 16 and the second surface 102 of the conductive structure 10. In one or more embodiments, the notch portion 16 does not extend below the top surfaces of the semiconductor elements 12. A radius 'r' is defined as a radius of curvature of the notch portion 16. A bending moment 'M' is shown in FIG. 2, and is described below with respect to FIG. 5.

Figure 3:
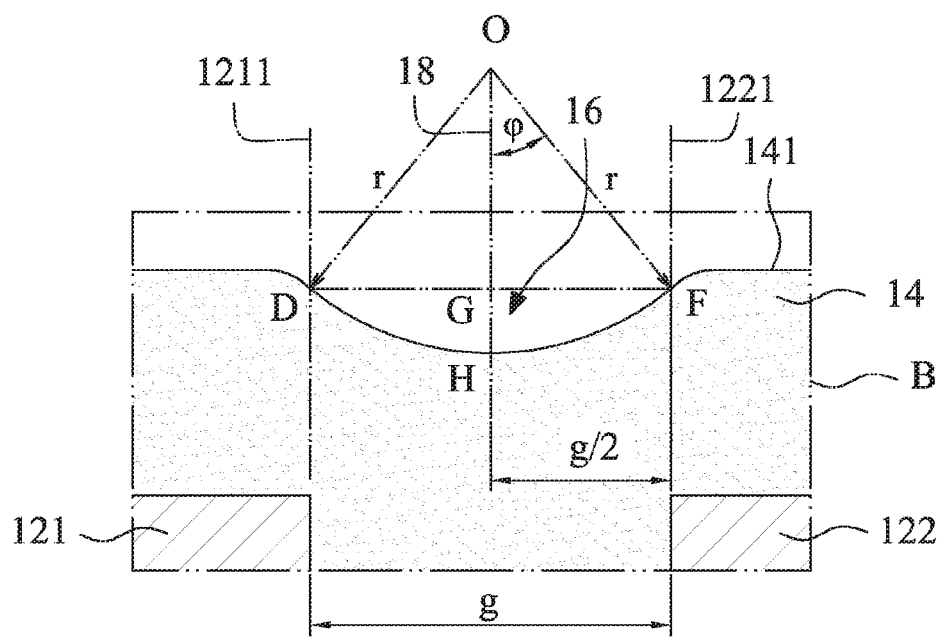
FIG. 3 illustrates an enlarged view of a section 'B' of FIG. 2 according to an embodiment of the present disclosure.

FIG. 3 illustrates an enlarged view of a section 'B' of FIG. 2 according to an embodiment of the present disclosure. In FIG. 3, a point 'O' is defined as an origin for the radius 'r', a point 'D' is defined as a left corner of the notch portion 16 and a point 'F' is defined as a right corner of the notch portion 16 (where left and right refer to the orientation of the cross-section as shown). There are two outermost radii 'r' illustrated (a line OD through points 'O' and 'D' and a line OF through the point 'O' and 'F') for the notch portion 16, and a center line 18 is defined as the angular bisector between the lines OD and OF. That is, the center line 18 is a center line between the first imaginary plane 1211 and the second imaginary plane 1221. The center line 18 and a line DF through points 'D' and 'F' intersect at a point 'G'. The lines OD and OF each have a length equal to the radius 'r', a line GF through the point 'G' and 'F' has a length of g/2, and an angle FOG defined by the points 'F', 'O' and 'G' is defined as 'φ'. Using trigonometric properties of the triangle OGF defined by the points 'O', 'G' and 'F', the relationship between the gap width 'g' and the radius 'r' is shown in equation (1), where "lineGF" refers to the length of the line GF, and "lineOF" refers to the length of the line OF.

$$\sin \varphi = \text{line}GF/\text{line}OF = (g/2)/r = g/2r \quad (1)$$

The value $\sin \varphi$ is a material property of the encapsulant 14 in an unstressed state (e.g., not bent or twisted). Thus, if the material of the encapsulant 14 is known, the radius 'r' may be determined from a known gap width 'g', or the gap width 'g' may be determined from a known radius 'r'. In other words, for a known material of the encapsulant 14, the radius 'r' and the gap width 'g' are proportional to each other, as shown in equation (2).

$$r \propto g/2 \quad (2)$$

Similarly, the material property $\sin \varphi$ of the encapsulant 14 may be determined from a known radius 'r' and known gap width 'g', as seen from equation (1). From equation (1), 'φ' may be determined as shown in equation (3).

$$\varphi = \sin^{-1}(g/2r) \quad (3)$$

Figure 4:
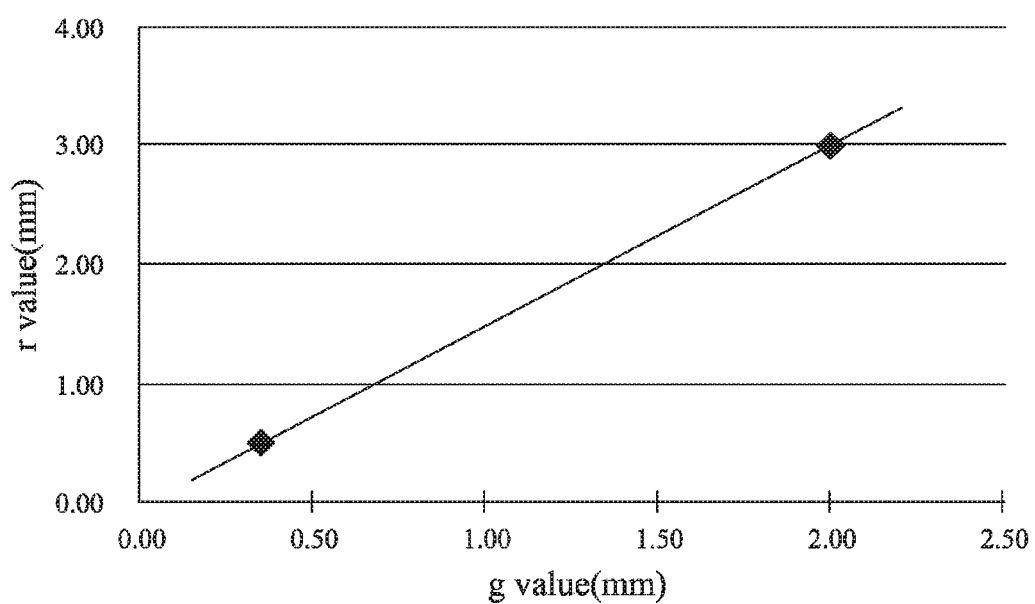
FIG. 4 illustrates a relationship between a gap value and a radius value according to an embodiment of the present disclosure.

FIG. 4 illustrates a relationship between the gap width 'g' and the radius 'r' according to test results related to an embodiment of the present disclosure in which the material property of the encapsulant 14 was theoretically $\sin \varphi = 0.5$. For a designed gap width g=2 millimeters (mm), the radius was measured as r=3 mm, and the material property calculated to be $\sin \varphi = 0.330$. For a designed gap width of g=0.35 mm, the radius was measured as r=0.49 mm, and the material property calculated to be $\sin \varphi = 0.357$.

Referring again to FIGS. 2 and 3, a surface of the notch portion 16 and the center line 18 intersect at a point 'H' (FIG. 3). A length of a line GH through the points 'G' and 'H' is defined as a depth of the notch portion 16. A maximum value for the depth (e.g., the maximum length of the line GH) is equal to the quantity w-d (the value of 'w' minus the value of 'd', FIG. 2). A length of a line OH through the points 'O' and 'H' is equal to the radius 'r'. A length of a line OG through the points 'O' and 'G' is equal to the length of the line OH minus the length of the line GH, or r−(w−d). Using trigonometric properties of the triangle OGF, the relationship of equation (4) is determined.

$$\cos \varphi = \text{line} OG/\text{line} OF = [r-(w-d)]/r \quad (4)$$

The value $\cos \varphi$ is also a material property of the encapsulant 14. Equation (5) is equation (4), solving for 'd'.

$$d = w - r(1 - \cos \varphi) \quad (5)$$

The encapsulant 14 has a Young's modulus 'E' and a rupture strength '$S_r$'. Referring again to FIG. 2, when a bending moment 'M' exists, or is appied, on the semiconductor package structure 1, a nominal stress, $\sigma_0$, will occur on an upper surface of the semiconductor package structure 1 (e.g., the top surface 141 of the encapsulant 14), as indicated in equation (6), where 'I' is the second moment of area, and $I = wd^3/12$.

$$\sigma_0 = M(d/2)/I = (Md)/2I \quad (6)$$

Figure 5:
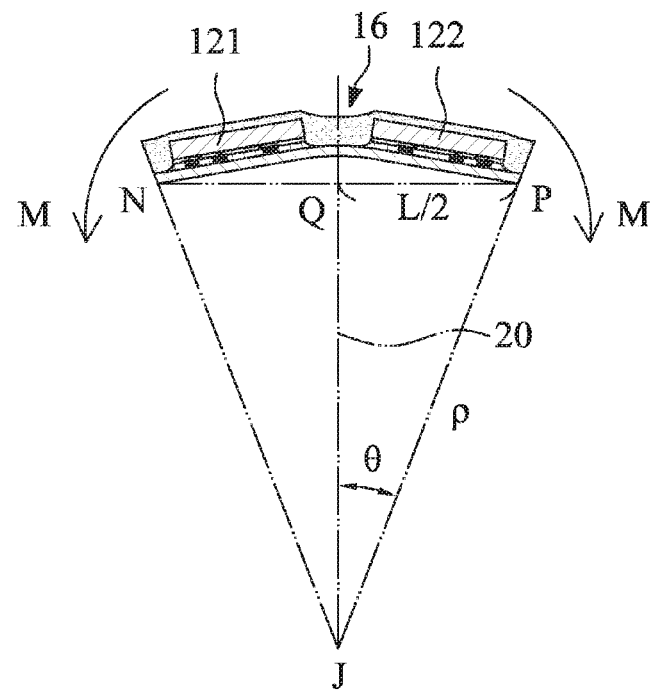
FIG. 5 illustrates the deformation of the semiconductor package structure in response to a bending moment according to an embodiment of the present disclosure.

FIG. 5 illustrates an example of deformation of a semiconductor package structure such as the semiconductor package structure 1 when the bending moment 'M' exists. A radius 'ρ' of a bending curve of the semiconductor package structure 1 when the bending moment 'M' exists is expressed by equation (7), where 'E' is the Young's modulus.

$$1/\rho = M/(EI) \quad (7)$$

A point 'J' is defined as an origin point of the radius 'ρ', a point 'N' is defined on a left lower end of the semiconductor package structure 1 and a point 'P' is defined on a right lower end of the semiconductor package structure 1 (where left and right refer to the orientation shown for the cross-section of FIG. 5). Two outermost radii are defined as a line JN through the points 'J' and 'N' and a line JP through the points 'J' and 'P'. A center line 20 is defined as an angular bisector between the lines JN and JP. The center line 20 is also a center line of the semiconductor package structure 1 in the embodiment illustrated in FIG. 5. The center line 20 and a line NP between the points 'N' and 'P' intersect at a point 'Q'. A length of the line JP is equal to 'ρ', and a length of a line QP between the points 'Q' and 'P' is equal to L/2 ('L' being the package width of the semiconductor package structure at the second surface 102 of the conductive structure 10, as shown in FIG. 2). Using trigonometric properties of the triangle PJQ defined by the points 'P', 'J' and 'Q', the relationship between the width 'L' and the radius 'ρ' is as shown in equation (8), and equation (8) is rearranged in equation (9) to solve for 'ρ'.

$$\sin \theta = \text{line} QP/\text{line} JP = (L/2)/\rho \quad (8)$$

$$1/\rho = (2 \sin \theta)/(L) \quad (9)$$

A maximum stress $\sigma_{max}$ will generally occur at the bottom surface of the notch portion 16, and the maximum stress $\sigma_{max}$ is expressed by equation (10), where 'K' is the stress concentration factor and '$S_r$' is the rupture strength.

$$\sigma_{max} = K\sigma_0 < S_r \quad (10)$$

Dividing equation (6) by equation (7), as shown in equation (11), a relationship between $\sigma_0$ and 'ρ' can be determined as shown in equation (12) and rearranged in equation (13) to solve for $\sigma_0$.

$$\frac{\sigma_0}{\left(\frac{1}{\rho}\right)} = \frac{(Md)/2I}{M/(EI)} \quad (11)$$

$$\sigma_0 \rho = (Ed)/2 \quad (12)$$

$$\sigma_0 = (Ed)/(2\rho) \quad (13)$$

Substituting 1/ρ of equation (9) into equation (13) results in equation (14).

$$\sigma_0 = [(Ed)/2] \times 1/\rho = [(Ed)/2] \times [(2 \sin \theta)/(L)] = [(Ed) \times \sin \theta]/L \quad (14)$$

Substituting $\sigma_0$ of equation (14) into equation (10) results in equation (15), rearranged as equation (16) to solve for 'E'.

$$\sigma_{max} = [K(Ed) \times \sin \theta]/L < S_r \quad (15)$$

$$E < (S_r \times L)/(K \times d \times \sin \theta) \quad (16)$$

The value of θ is from 0 degrees to 180 degrees, thus, $0 \le \sin \theta \le 1$. Under a worst case design scenario, $\sin \theta = 1$, and equation (16) becomes as shown in equation (17), rearranged in equations (18) and (19).

$$E < (S_r \times L)/(K \times d) \quad (17)$$

$$E/Sr < L/(K \times d) \quad (18)$$

$$L/(K \times d) > E/Sr \quad (19)$$

According to principles of stress theory, the stress concentration factor 'K' in equations (10) and (15)-(19) will be greater than about 1.2, or less than about 3.0, or in a range between about 1.4 and about 3.0, for w>d, and r/d between about 0.02 and about 0.35 for the semiconductor package structure 1 of FIGS. 1-5.

The $E/S_r$ value of equation (19) is determined by the package width 'L', the stress concentration factor 'K' and the minimum distance 'd'. The value of 'd' is a function of the thickness 'w' and the gap width 'g' as shown in equations (3) and (5). Therefore, if the package width 'L', the gap width 'g' and the thickness 'w' are predetermined, the material of the encapsulant 14 can be selected to satisfy the calculated $E/S_r$ from equation (19). Alternatively, if the material of the encapsulant 14 is selected (that is, the rupture strength '$S_r$' and the Young's modulus 'E' are known), then a ratio of the package width 'L' to the minimum distance 'd' can be determined by equation (19). For example, if the encapsulant 14 has a rupture strength '$S_r$' of 31 megapascals (MPa), stress concentration factor 'K' is set to an approximate worst case value of 3.0, the package width 'L' is designed to be 27.1 mm, and the minimum distance 'd' is designed to be 1.0 mm, then, the Young's modulus 'E' is less than 0.28 gigapascals (GPa) from equation (19). In this example, a thermoplastic material (e.g., TZNR-A4012) with E<0.28 GPa may be selected as the material of the encapsulant 14. For another example, if the encapsulant 14 has a rupture strength '$S_r$' of 31 MPa, the stress concentration factor 'K' is set to an approximate worst case value of 3.0, and the Young's modulus 'E' is 0.28 GPa (or less), then a ratio of the package width 'L' to the minimum distance 'd' can be designed to be greater than 27.1.

If the material of the encapsulant 14 and the profile of the semiconductor package structure 1 satisfy equation (19), the semiconductor package structure 1 will be bendable along the notch portion 16 without rupture. That is, an angle may be formed between planes defined by top surfaces of two adjacent semiconductor elements 12 (e.g., between the first top surface 123 of the first semiconductor element 121 and the second top surface 124 of the second semiconductor element 122) by the existence of a bending moment. The angle may be less than about 180° (for a bending moment in the direction shown in FIG. 5 as bending moment 'M'), such as a non-zero angle of at least about 1° or at least about 5° or at least about 10°, and less than about 90° or less than about 45°. The angle may be greater than about 180° (for a bending moment opposite to the bending moment 'M' shown in FIG. 5), such as greater than about 270° or greater than about 315°.

Figure 6:
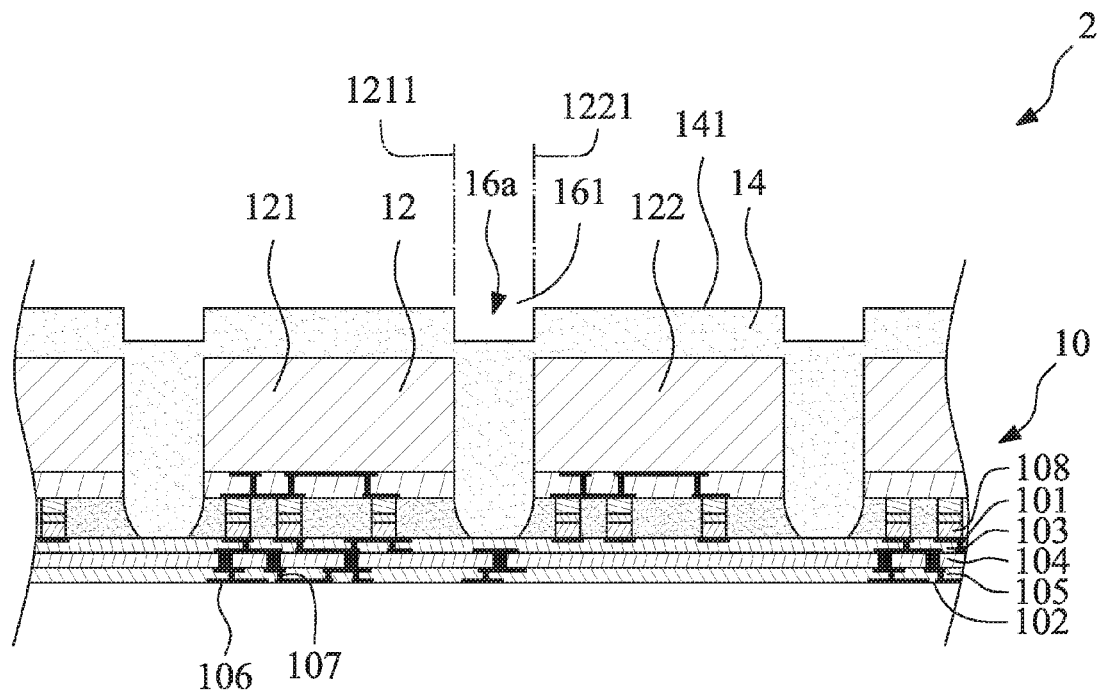
FIG. 6 illustrates a cross-sectional view of a semiconductor package structure according to an embodiment of the present disclosure.

FIG. 6 illustrates a cross-sectional view of a semiconductor package structure 2 according to an embodiment of the present disclosure. The semiconductor package structure 2 is similar to the semiconductor package structure 1 as shown in FIG. 1, except that a notch portion 16a is rectangular in cross-section in FIG. 6, rather than curved as in FIG. 1. Equation (19) can be used to approximate parameters of the semiconductor package structure 2.

Figure 7:
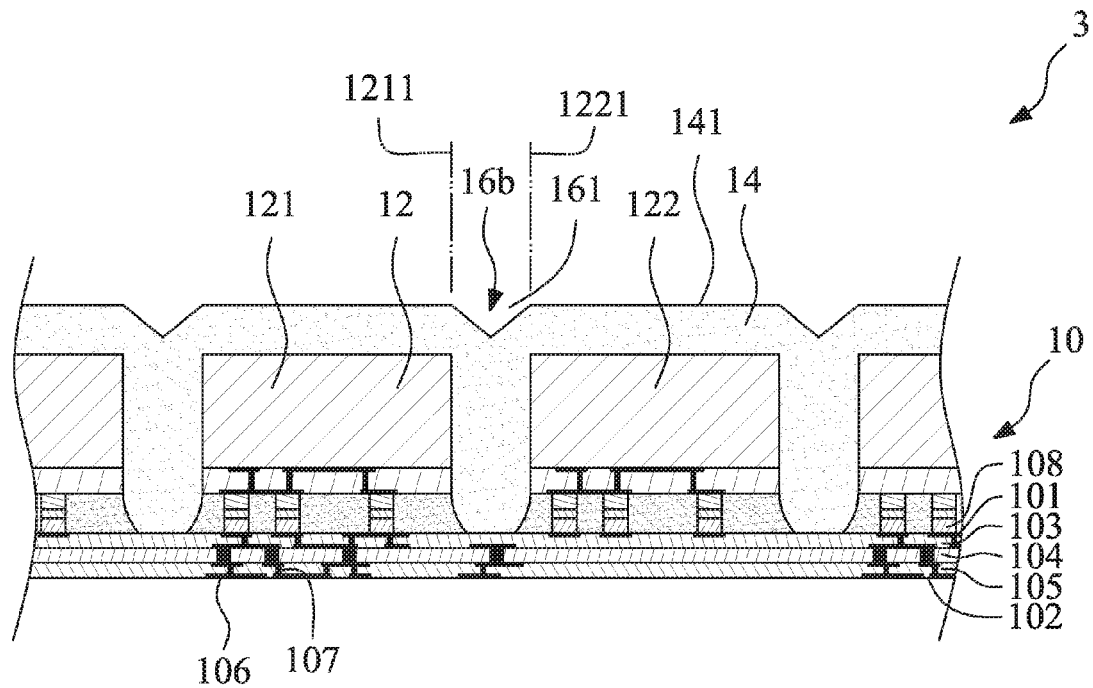
FIG. 7 illustrates a cross-sectional view of a semiconductor package structure according to an embodiment of the present disclosure.

FIG. 7 illustrates a cross-sectional view of a semiconductor package structure 3 according to an embodiment of the present disclosure. The semiconductor package structure 3 is similar to the semiconductor package structure 1 as shown in FIG. 1, except that a notch portion 16b is triangular in cross section in FIG. 7, rather than curved as in FIG. 1. Equation (19) can be used to approximate parameters of the semiconductor package structure 3.

Figure 8:
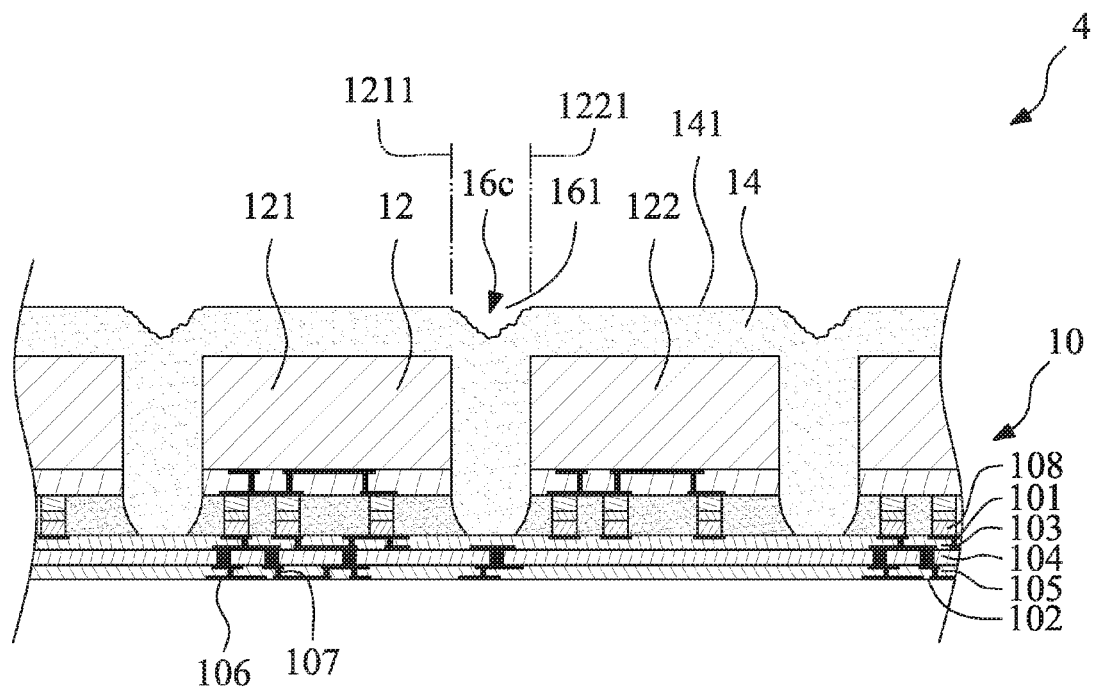
FIG. 8 illustrates a cross-sectional view of a semiconductor package structure according to an embodiment of the present disclosure.

FIG. 8 illustrates a cross-sectional view of a semiconductor package structure 4 according to an embodiment of the present disclosure. The semiconductor package structure 4 is similar to the semiconductor package structure 1 as shown in FIG. 1, except that a notch portion 16c is irregular in cross section in FIG. 7, rather than curved as in FIG. 1. Equation (19) can be used to approximate parameters of the semiconductor package structure 4.

Figure 9:
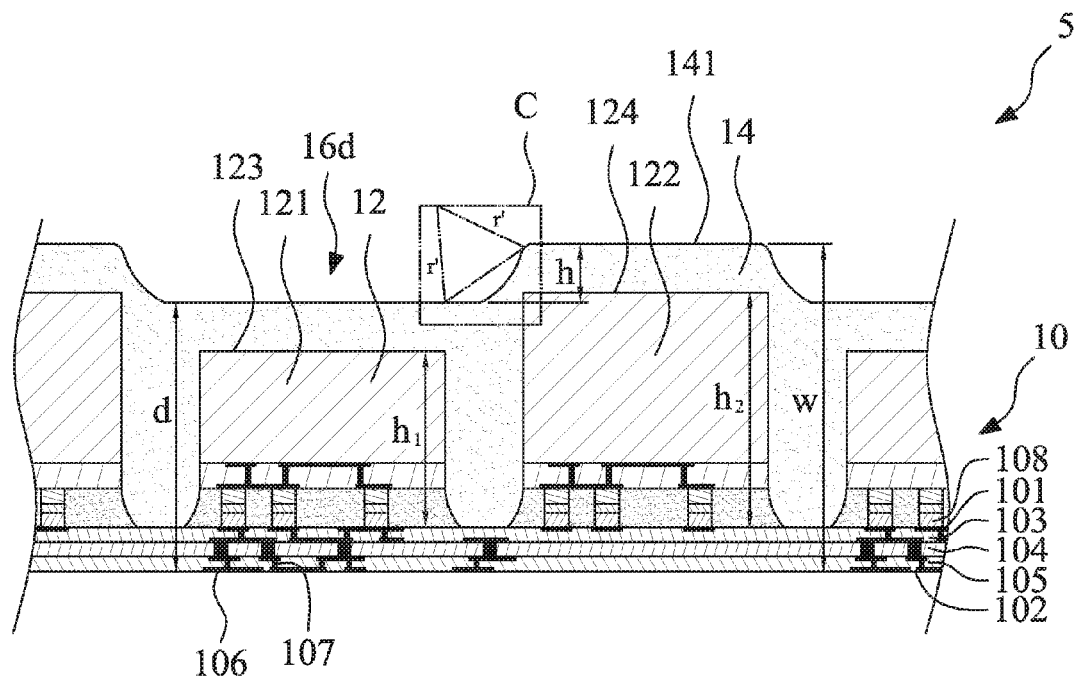
FIG. 9 illustrates a cross-sectional view of a semiconductor package structure according to an embodiment of the present disclosure.

FIG. 9 illustrates a cross-sectional view of a semiconductor package structure 5 according to an embodiment of the present disclosure. The semiconductor package structure 5 is similar to the semiconductor package structure 1 as shown in FIG. 1, except that the thicknesses of the semiconductor elements 12 are not the same. In the embodiment illustrated in FIG. 9, the thickness of the first semiconductor element 121 is less than the thickness of the second semiconductor element 122, and a notch portion 16d extends to a position above the first semiconductor element 121. A distance between the first top surface 123 of the first semiconductor element 121 and the first surface 101 of the conductive structure 10 is defined as '$h_1$', a distance between the second top surface 124 of the second semiconductor element 122 and the first surface 101 of the conductive structure 10 is defined as '$h_2$', a thickness difference between the first semiconductor element 121 and the second semiconductor element 122 is $|h_1-h_2|$, and a depth h of the notch portion 16d is approximately equal to the thickness difference $|h_1-h_2|$.

Figure 10:
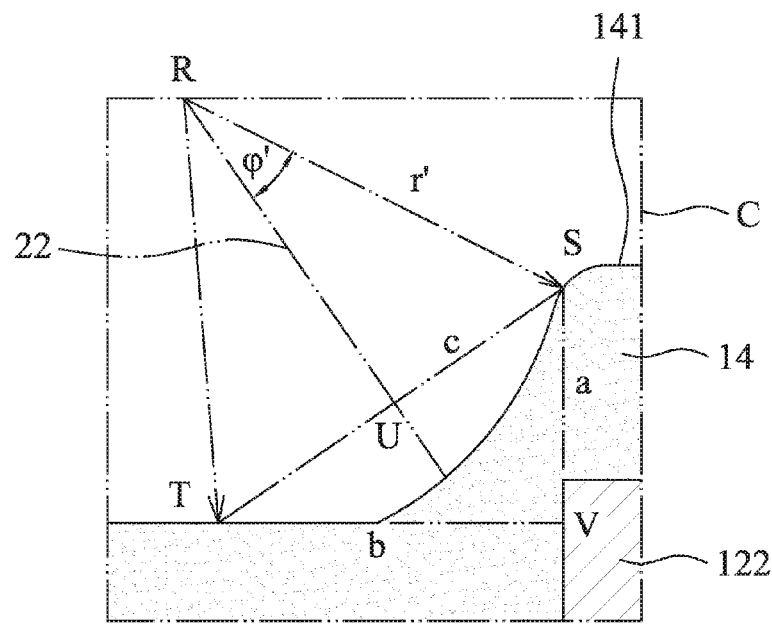
FIG. 10 illustrates an enlarged view of a section 'C' of FIG. 9 according to an embodiment of the present disclosure.

FIG. 10 illustrates an enlarged view of a section 'C' of FIG. 9 according to an embodiment of the present disclosure. In FIG. 10, a radius r' is defined as a radius of a side wall of the notch portion 16d, 'R' is defined as an origin point of the radius r', 'S' is defined as a right corner of the notch portion 16d (in the cross section orientation shown), and 'T' is defined as a position on a bottom surface of the notch portion 16d corresponding to a right corner of the first semiconductor element 121. There are two outermost radii r' (a line RS through the points 'R' and 'S' and a line RT through the points 'R' and 'T'), and a center line 22 is defined as an angular bisector between the lines RS and RT. The center line 22 and the line ST intersect at a point 'U'. A bottom surface of the notch portion 16d and a plane along a side surface of the second semiconductor element 122 intersect along a line including a point 'V'. In the triangle SVT defined by the points 'S', 'V' and 'T', a length of a line SV along a side of the triangle SVT is equal to 'a', a length of a line TV along a side of the triangle SVT is equal to 'b', and a length 'c' of a line ST along a side of the triangle SVT is equal to $\sqrt{a^2+b^2}$. In a triangle RSU defined by the points 'R', 'S' and 'U', a length of the line RS is equal to r', a length of a line SU along a side of the triangle RSU is equal to $(\sqrt{a^2+b^2})/2$, and an angle between the line RS and a line RU along a side of the triangle RSU is defined as φ'. Using trigonometric properties of the triangle RSU, the relationship of equation (20) is determined.

$$\sin \varphi' = \text{line}SU/\text{line}RS = [(\sqrt{a^2+b^2})/2]/r' = (\sqrt{a^2+b^2})/2r' \quad (20)$$

The sin φ' value is a material property of the encapsulant 14. Therefore, the radius r' is proportional to $c=\sqrt{a^2+b^2}$ as shown in equation (21).

$$r' \propto (\sqrt{a^2+b^2})/2 \quad (21)$$

Equation (19) can be used to approximate parameters of the semiconductor package structure 5, by replacing the minimum distance 'd' in equation (19) with the term w-h (see FIG. 9), as shown in equation (22).

$$L/[K \times (w-h)] > E/Sr \quad (22)$$

According to principles of stress theory, the stress concentration factor 'K' in equation (22) will be in a range between about 1.2 and about 3.0, for w/(w−h) between about 1.02 and about 3.0, and r'/(w−h) between about 0.02 and about 0.35.

Figure 11:
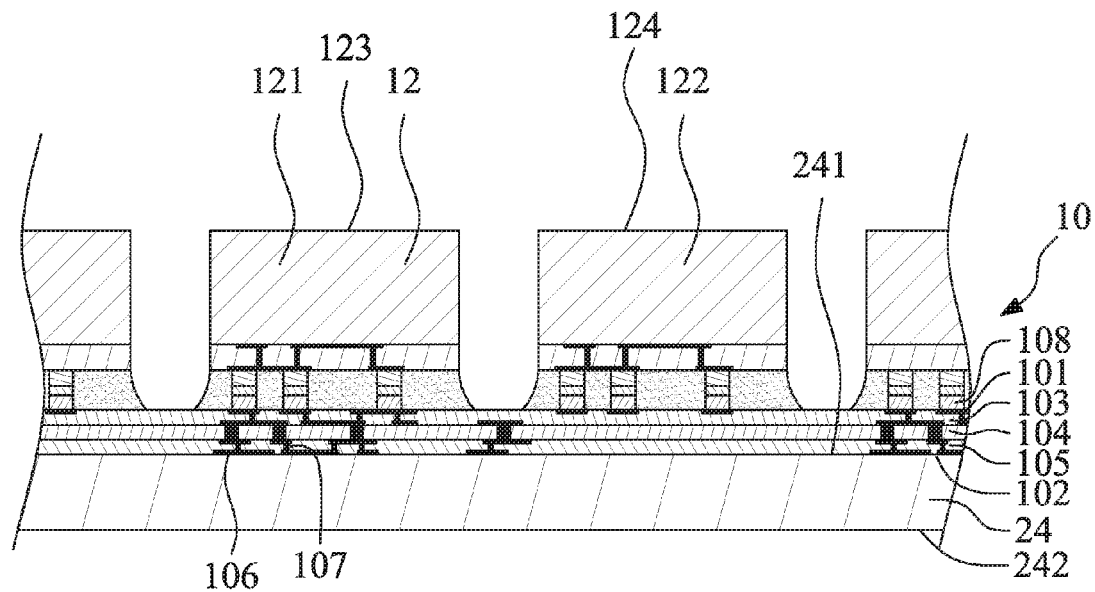
FIG. 11, FIG. 12, FIG. 13 and FIG. 14 illustrate a method for manufacturing a semiconductor package structure according to an embodiment of the present disclosure.

FIGS. 11-14 illustrate a method for manufacturing a semiconductor package structure according to an embodiment of the present disclosure. Referring to FIG. 11, at least two semiconductor elements 12 and a semiconductor substrate 24 are provided. In this embodiment, the semiconductor elements 12 include a first semiconductor element 121 and a second semiconductor element 122, which are semiconductor dice. The semiconductor substrate 24 may be a silicon wafer. The semiconductor substrate 24 has a first surface 241 and a second surface 242. A conductive structure 10 is disposed on the first surface 241 of the semiconductor substrate 24.

The conductive structure 10 is flexible. The conductive structure 10 has a first surface 101 and a second surface 102 opposite the first surface 101. The conductive structure 10 includes an RDL that includes a first insulation layer 103, a second insulation layer 104, a third insulation 105, circuit layers 106, conductive vias 107 and conductive bumps 108.

The first insulation layer 103 may be, for example, a passivation layer, and the material thereof may be, or may include, a PI, an epoxy, PBO, BCB, $SiO_2$, or other suitable material. The second insulation layer 104 may be, for example, a polymer layer, and the material thereof may be, or may include, an NCF, an NCP, ABF, or other suitable material. The third insulation layer 105 may be, for example, a passivation layer, and the material thereof may be, or may include, a PI, an epoxy, PBO, BCB, $SiO_2$, or other suitable material. The material of the third insulation layer 105 may be same as, or different from, the material of the first insulation layer 103.

The patterned circuit layers 106 are disposed on or embedded in the first insulation layer 103 or the third insulation layer 105. The second insulation layer 104 is disposed between the first insulation layer 103 and the third insulation layer 105. In one or more embodiments, the second insulation layer 104 may be omitted. In one or more embodiments, insulation layers additional to the second insulation layer 104 may be disposed between the first insulation layer 103 and the third insulation layer 105. Portions of the conductive vias 107 are disposed in the first insulation layer 103, the second insulation layer 104 (and additional insulation layers if applicable) and the third insulation 105, to electrically connect the patterned circuit layers 106 to each other vertically (in the orientation shown). A top patterned circuit layer 106 is exposed from the first surface 101 of the conductive structure 10, and the conductive bumps 108 are disposed on the top patterned circuit layer 106.

The semiconductor elements 12 are disposed on the conductive structure 10. In this embodiment, the semiconductor elements 12 are disposed on and electrically connected to the first surface 101 of the conductive structure 10 by flip-chip bonding. The semiconductor elements 12 connect to the conductive bumps 108 of the conductive structure 10.

Figure 12:
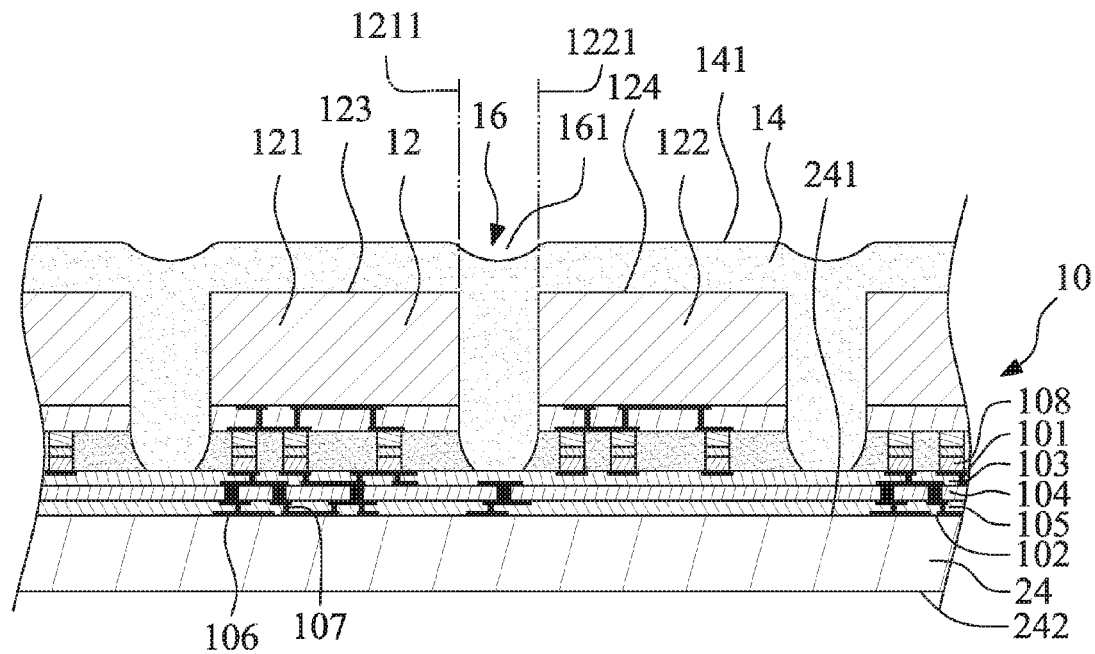

Referring to FIG. 12, an encapsulant 14 is disposed to cover the semiconductor elements 12 and the first surface 101 of the conductive structure 10. The encapsulant 14 may be applied using any of a number of coating techniques, such as printing, spinning, or spraying. In one or more embodiments, the encapsulant 14 is, or includes, a thermoplastic material, such as B-stage TZNR-A4012. In other embodiments, the encapsulant 14 is another material, and may be another B-stage material.

The encapsulant 14 defines at least one notch portion 16. In one or more embodiments, the encapsulant 14 is applied using a spin coating technique, and the notch portion 16 is formed during the spin coating, such as resulting from the presence of a gap between two adjacent semiconductor elements 121, 122. A first imaginary plane 1211 extends vertically (in the orientation shown) from a side wall of the first semiconductor element 121 that faces the second semiconductor element 122, and a second imaginary plane 1221 extends vertically from a side wall of the second semiconductor element 122 that faces the first semiconductor element 121. The notch portion 16 is disposed between the first imaginary plane 1211 and the second imaginary plane 1221. That is, the notch portion 16 is disposed between two imaginary planes 1211, 1221 extending from two adjacent side walls of two adjacent semiconductor elements 121, 122, respectively.

Figure 13:
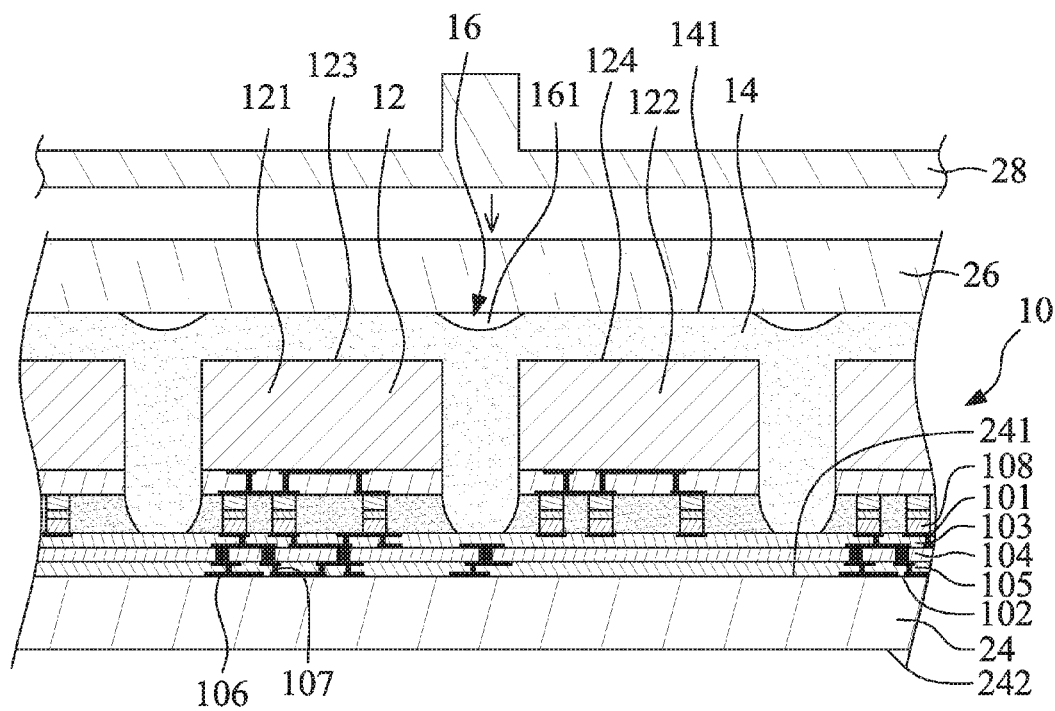

Referring to FIG. 13, a carrier 26 is attached to a top surface 141 of the encapsulant 14. In one or more embodiments, the carrier 26 is a glass plate, and is attached to the encapsulant 14 using a compression head 28. In one or more embodiments, the encapsulant 14 is a B-stage material, and the carrier 26 is adhered to the B-stage material. Then, the encapsulant 14 is cured.

Figure 14:
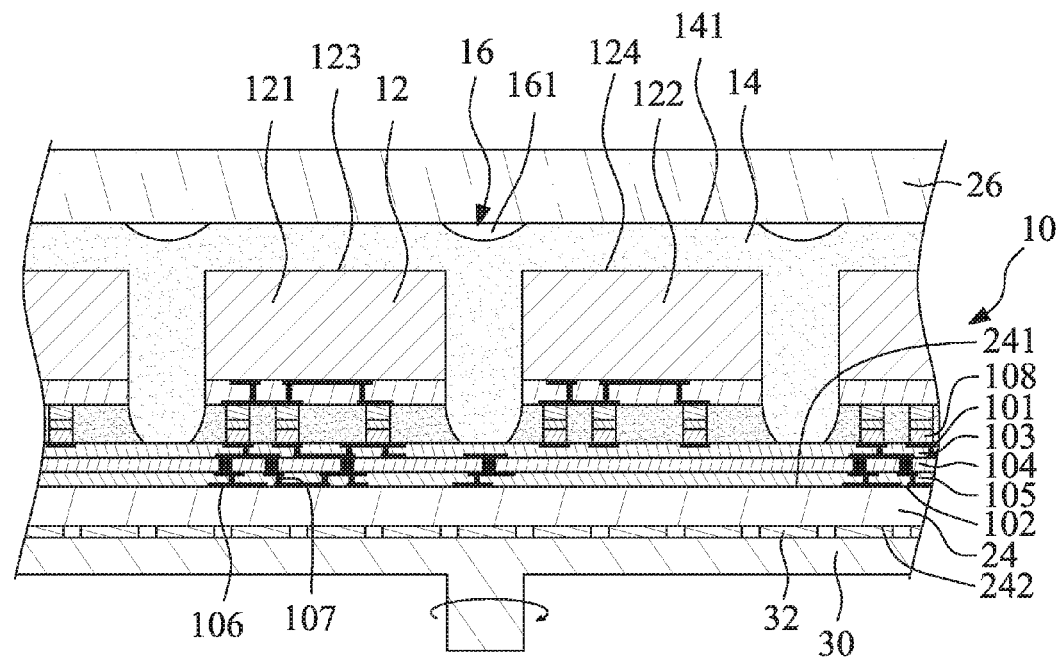

Referring to FIG. 14, the semiconductor substrate 24 is removed. As shown in the embodiment of FIG. 14, a polishing disc 30 with polishing pads 32 fixed thereon is used to polish the semiconductor substrate 24 from the second surface 242 of the semiconductor substrate 24. After the semiconductor substrate 24 is removed, the carrier 26 is removed by, for example, stripping, and the semiconductor package structure 1 illustrated in FIG. 1 is obtained. The semiconductor package structure 1 is bendable along the notch portion 16. The method of FIGS. 11-14 also can be adapted to obtain the semiconductor package structures 2-5 illustrated in FIGS. 6-9.

Figure 15:
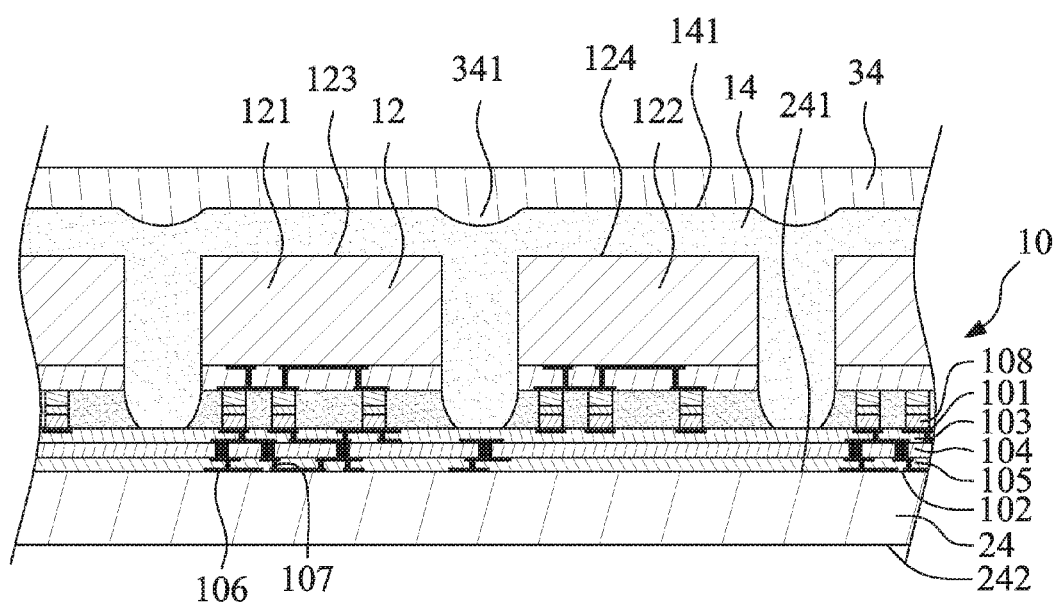
FIG. 15 illustrates a method for manufacturing a semiconductor package structure according to an embodiment of the present disclosure.

FIG. 15 illustrates a method for manufacturing a semiconductor package structure according to an embodiment of the present disclosure. The initial stage of this embodiment is the same as shown in FIG. 11, and the stage of FIG. 15 is subsequent to the stage of FIG. 11. As shown in FIG. 15, a mold 34 having a plurality of protrusion portions 341 on a surface thereof is provided. The mold 34 is pressed to contact the top surface 141 of the encapsulant 14, and the protrusion portions 341 extrudes the encapsulant 14 to form the notch portion 16. The carrier bonding stage as in FIG. 13 and the removal of the semiconductor substrate 24 and the carrier 26 as in FIG. 14 are next performed, to obtain the semiconductor package structure 1 illustrated in FIG. 1. The method of FIG. 15 also can be adapted to obtain the semiconductor package structures 2-5 illustrated in FIGS. 6-9.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "approximately" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
a conductive structure having a first surface and a second surface opposite the first surface;
at least two semiconductor elements disposed on and electrically connected to the first surface of the conductive structure; and
an encapsulant covering the semiconductor elements and the first surface of the conductive structure, wherein the encapsulant has a width 'L' and defines at least one notch portion, a minimum distance 'd' is between a bottom surface of the notch portion and the second surface of the conductive structure, the encapsulant has a Young's modulus 'E' and a rupture strength 'Sr', and L/(K×d)>E/Sr, wherein 'K' is a stress concentration factor with a value of greater than 1.2.

2. The semiconductor package structure according to claim 1, wherein the notch portion includes an opening on a first surface of the encapsulant, and the notch portion is disposed between two imaginary planes, a first of the imaginary planes extending from a side wall of a first semiconductor element and a second of the imaginary planes extending from a side wall of a second semiconductor element adjacent to the first semiconductor element.

3. The semiconductor package structure according to claim 1, wherein the semiconductor elements comprise a first semiconductor element and a second semiconductor element, a thickness of the first semiconductor element is less than a thickness of the second semiconductor element, the notch portion extends to a position directly above the first semiconductor element, and the minimum distance 'd' is equal to a total thickness 'w' of the semiconductor package structure minus a thickness difference 'h' between the first semiconductor element and the second semiconductor element.

4. The semiconductor package structure according to claim 1, wherein the conductive structure includes a redistribution layer.

5. The semiconductor package structure according to claim 1, wherein the encapsulant comprises a thermoplastic material.

6. The semiconductor package structure according to claim 1, wherein d=w−r(1−cos φ), wherein 'w' is a total thickness of the semiconductor package structure, 'r' is a radius of a side wall of the notch portion, and cos φ is a material property of the encapsulant, wherein φ is an angle between (i) an imaginary line extending from a center of curvature of the notch to a center of the notch, and (ii) an imaginary line extending from the center of curvature of the notch to a corner of the notch.

7. The semiconductor package structure according to claim 1, wherein 'K' is less than 3.0.

8. The semiconductor package structure according to claim 1, wherein the semiconductor package structure is bendable along the notch portion.

9. The semiconductor package structure according to claim 1, wherein each of the semiconductor elements has a top surface, and an angle between a plane defined by the top surface of a first one of the semiconductor elements and a plane defined by the top surface of an adjacent second one of the semiconductor elements is less than 180 degrees.

10. The semiconductor package structure according to claim 1, wherein each of the semiconductor elements has a top surface, and an angle between a plane defined by the top surface of a first one of the semiconductor elements and a plane defined by the top surface of an adjacent second one of the semiconductor elements is greater than 180 degrees.

11. A semiconductor package structure, comprising:
a flexible conductive structure;
at least two semiconductor elements disposed on and electrically connected to the conductive structure;
an encapsulant covering the semiconductor elements and a surface of the conductive structure, wherein the encapsulant comprises a thermoplastic material and defines at least one notch portion, wherein the semiconductor package structure is bendable along the notch portion; and
wherein the notch portion extends from a first imaginary plane to a second imaginary plane, the first imaginary plane extending from a side wall of a first of the at least two semiconductor elements and the second imaginary plane extending from a side wall of a second of the at least two semiconductor elements adjacent to the first of the at least two semiconductor elements.

12. The semiconductor package structure according to claim 11, wherein each of the semiconductor elements has a top surface, and an angle between a plane defined by a top surface of the first of the semiconductor elements and a plane defined by a top surface of the adjacent second of the semiconductor elements is less than 180 degrees.

13. The semiconductor package structure according to claim 11, wherein each of the semiconductor elements has a top surface, and an angle between a plane defined by a top surface of the first of the semiconductor elements and a plane defined by a top surface of the adjacent second of the semiconductor elements is greater than 180 degrees.

14. The semiconductor package structure according to claim 11, wherein a thickness of the first semiconductor element is less than a thickness of the second semiconductor element.

15. The semiconductor package structure according to claim 11, wherein the conductive structure includes a redistribution layer.

16. The semiconductor package structure according to claim 11, wherein:
the conductive structure has a first surface and a second surface,
the at least two semiconductor elements are disposed on and electrically connected to the first surface of the conductive structure,
the encapsulant covers the first surface of the conductive structure, has a width a 'L', a minimum distance 'd' between a bottom surface of the notch portion and the second surface of the conductive structure, the encapsulant has a Young's modulus 'E' and a rupture strength 'Sr', and L/(K×d)>E/Sr, wherein 'K' is a stress concentration factor with a value of greater than 1.2.

17. The semiconductor package structure according to claim 11, wherein:
the conductive structure has a first surface and a second surface,
the at least two semiconductor elements are disposed on and electrically connected to the first surface of the conductive structure, the encapsulant covers the first surface of the conductive structure, has a width 'L' a minimum distance 'd' between a bottom surface of the notch portion and the second surface of the conductive structure, the encapsulant has a Young's modulus 'E' and a rupture strength 'Sr', and L/(K×d)>E/Sr, wherein 'K' is a stress concentration factor with a value of greater than 1.2, and a thickness of the first semiconductor element is less than a thickness of the second semiconductor element, and the minimum distance 'd' is equal to a total thickness 'w' of the semiconductor package structure minus a thickness difference 'h' between the first semiconductor element and the second semiconductor element.

18. The semiconductor package structure according to claim 11, wherein:

the conductive structure has a first surface and a second surface, the at least two semiconductor elements are disposed on and electrically connected to the first surface of the conductive structure, the encapsulant covers the first surface of the conductive structure, has a width 'L', a minimum distance 'd' between a bottom surface of the notch portion and the second surface of the conductive structure, the encapsulant has a Young's modulus 'E' and a rupture strength 'Sr', and L/(K×d)>E/Sr, wherein 'K' is a stress concentration factor with a value of greater than 1.2, and $d = w - r(1 - \cos \varphi)$, wherein 'w' is a total thickness of the semiconductor package structure, 'r' is a radius of a side wall of the notch portion, and $\cos \varphi$ is a material property of the encapsulant, wherein $\varphi$ is an angle between (i) an imaginary line extending from a center of curvature of the notch to a center of the notch, and (ii) an imaginary line extending from the center of curvature of the notch to a corner of the notch.

19. The semiconductor package structure according to claim 11, wherein:

the conductive structure has a first surface and a second surface, the at least two semiconductor elements are disposed on and electrically connected to the first surface of the conductive structure, the encapsulant covers the first surface of the conductive structure, has a width 'L', a minimum distance 'd' between a bottom surface of the notch portion and the second surface of the conductive structure, the encapsulant has a Young's modulus 'E' and a rupture strength 'Sr', and L/(K×d)>E/Sr, wherein 'K' is a stress concentration factor with a value of greater than 1.2, and 'K' is less than 3.0.

* * * * *